(12) United States Patent
Anami

(10) Patent No.: US 9,591,774 B2
(45) Date of Patent: Mar. 7, 2017

(54) ELECTRICAL JUNCTION BOX

(71) Applicant: SUMITOMO WIRING SYSTEMS, LTD., Yokkaichi-shi, Mie (JP)

(72) Inventor: Shuichi Anami, Yokkaichi (JP)

(73) Assignee: SUMITOMO WIRING SYSTEMS, LIMITED, Mie (JP)

( * ) Notice: Subject to any disclaimer, the term of this patent is extended or adjusted under 35 U.S.C. 154(b) by 0 days.

(21) Appl. No.: 14/432,659

(22) PCT Filed: Sep. 24, 2013

(86) PCT No.: PCT/JP2013/075743
§ 371 (c)(1),
(2) Date: Mar. 31, 2015

(87) PCT Pub. No.: WO2014/054463
PCT Pub. Date: Apr. 10, 2014

(65) Prior Publication Data
US 2015/0245505 A1 Aug. 27, 2015

(30) Foreign Application Priority Data
Oct. 4, 2012 (JP) ................. 2012-222259

(51) Int. Cl.
H02G 3/08 (2006.01)
H05K 5/00 (2006.01)
(Continued)

(52) U.S. Cl.
CPC ....... *H05K 5/0056* (2013.01); *B60R 16/0239* (2013.01); *H02G 3/088* (2013.01);
(Continued)

(58) Field of Classification Search
CPC .................................................. B60R 16/0239
(Continued)

(56) References Cited

U.S. PATENT DOCUMENTS 5,629,495 A * 5/1997 Sumida .............. B60R 16/0239
174/12 R
2004/0214458 A1 * 10/2004 Maebashi ................ H01H 9/10
439/76.2
(Continued)

FOREIGN PATENT DOCUMENTS

| JP | 2003-137031 A | 5/2003 |
| JP | 2008-295263 A | 12/2008 |
| JP | 2009-040353 A | 2/2009 |

OTHER PUBLICATIONS

Nov. 26, 2013 International Search Report issued in PCT/JP2013/075743.

*Primary Examiner* — Hung V Ngo
(74) *Attorney, Agent, or Firm* — Oliff PLC

(57) ABSTRACT

An electrical junction box having a novel structure in which a cover is externally fitted and assembled to a main body provided with a circuit board. The electrical junction box enables water that has entered the cover from reaching the circuit board via a micro-gap between the main body and the cover. At least one of an outer surface of a main body and an inner surface of a cover that oppose each other in a state in which the cover is assembled to the main body provided with a circuit board is provided with a guiding drain groove for guiding the water in the horizontal direction using capillary action.

5 Claims, 6 Drawing Sheets

(51) Int. Cl.
*B60R 16/023* (2006.01)
*H05K 5/02* (2006.01)
*H02G 3/14* (2006.01)

(52) U.S. Cl.
CPC ........... *H05K 5/0208* (2013.01); *H02G 3/086* (2013.01); *H02G 3/14* (2013.01)

(58) Field of Classification Search
USPC ........................................................ 439/76.2
See application file for complete search history.

(56) References Cited

U.S. PATENT DOCUMENTS

| | | | |
|---|---|---|---|
| 2008/0299799 A1 | 12/2008 | Yoshida et al. | |
| 2008/0299800 A1* | 12/2008 | Yoshida ............. | H01R 13/5227 439/76.2 |
| 2010/0319951 A1* | 12/2010 | Nakayama ............. | H02G 3/086 174/50 |
| 2010/0326692 A1* | 12/2010 | Ozawa ................... | H02G 3/088 174/50.52 |
| 2012/0097693 A1* | 4/2012 | Takeuchi ............... | H02G 3/088 220/810 |

* cited by examiner

ELECTRICAL JUNCTION BOX

TECHNICAL FIELD

This application is directed to an electrical junction box in which a cover is assembled to a main body provided with a circuit board, and in particular to an electrical junction box in which a cover is externally fitted to a main body and is assembled in a state in which the main body is accommodated in the cover.

BACKGROUND

Conventionally, electrical junction boxes are used in automobiles and the like in order for electrical components such as fuses, relays, and the like to be arranged space-efficiently, for example. As such an electrical junction box, an electrical junction box as disclosed in, for example, JP 2008-295263A (Patent Document 1) is known that has a structure in which a cover is externally fitted to a main body provided with a circuit board such as a printed-circuit board, and the main body is accommodated in the cover.

Meanwhile, in view of the demand for downsizing in recent years, an electrical junction box as disclosed in Patent Document 1 is configured such that a cover is externally fitted to a main body with almost no gap, and the outer surface of the main body and the inner surface of the cover face each other with a very small micro-gap.

Therefore, if water enters the cover through, for example, a gap between the open end of the cover and the main body, capillary action may act in the micro-gap between the outer surface of the main body and the inner surface of the cover, and water may deeply enter the cover. Furthermore, there is the risk that the water that has entered the cover reaches the circuit board of the main body, resulting in a short circuit or corrosion of the circuit board.

CITATION LIST

Patent Documents

Patent Document 1: JP 2008-295263A

SUMMARY

Technical Problem

Disclosed embodiments were made in view of the above-described circumstances, and it is an object of this disclosure to provide an electrical junction box having a novel structure that is capable of preventing water that has entered a cover from reaching a circuit board.

Solution to Problem

In a first embodiment, there is provided an electrical junction box in which a cover is externally fitted to a main body provided with a circuit board, and is assembled in a state in which the main body is accommodated in the cover, wherein at least one of an outer surface of the main body and an inner surface of the cover that oppose each other in a state in which the cover is assembled is provided with a guiding drain groove for guiding water in a horizontal direction using capillary action.

In this embodiment, water that enters the cover and climbs vertically upward in a micro-gap between the main body and the cover due to capillary action can be captured in the guiding drain groove and guided in the horizontal direction due to capillary action in the guiding drain groove. Accordingly, it is possible to prevent water that has entered the cover from climbing and reaching the circuit board. As a result, it is possible to prevent a short circuit or corrosion of the circuit board due to the circuit board getting wet.

Particularly, the guiding drain groove is set to have a size in which capillary action can act. Accordingly, it is possible to guide the water in the horizontal direction positively using capillary action, and to effectively prevent the water from climbing. Note that "to guide the water in the horizontal direction" in this aspect means that it is sufficient for the water to be able to be guided with the horizontal direction component, and the guiding drain groove may be provided inclined in the vertical direction. For example, by providing the guiding drain groove that extends in the horizontal direction and is inclined vertically downward, it is possible to exert more effectively an effect of guiding water by effectively using both capillary action and gravity. The guiding drain groove may also be provided on either or both of the main body or the cover.

In a second embodiment, there is provided the electrical junction box according to the first embodiment, wherein at least one of the outer surface of the main body and the inner surface of the cover is provided with a recess-shaped uneven part that extends in a vertical direction and has a shape of a recess that is spaced from the corresponding opposing inner surface of the cover or opposing outer surface of the main body, and the recess-shaped uneven part is provided with the guiding drain groove.

In this embodiment, the recess-shaped uneven part enables the size of a gap between the main body and the cover to be large enough to the extent that no capillary action acts. Accordingly, the recess-shaped uneven part can prevent water from climbing in the cover due to capillary action.

Furthermore, by providing the recess-shaped uneven part with the guiding drain groove, even when water has climbed on the recess-shaped uneven part, it is possible for the guiding drain groove to prevent the climbing of the water.

In a third embodiment, there is provided the electrical junction box according to the second embodiment, wherein the recess-shaped uneven part has a pair of water stopping protrusions that extend in parallel to each other in a horizontal direction, and the guiding drain groove is formed by a gap between the pair of water stopping protrusions.

According to this embodiment, even when water has climbed on the recess-shaped uneven part, it is possible for the water stopping protrusions to prevent the climbing of the water. Furthermore, by providing the guiding drain groove between the pair of water stopping protrusions, it is possible for the water to be captured in the guiding drain groove and to be guided in the horizontal direction even when the water has run over the water stopping protrusions, more reliably preventing the climbing of the water.

In a fourth embodiment, there is provided the electrical junction box according to the second or third embodiment, wherein the main body has an abutment restricting surface that protrudes outward from the main body and opposes an opening end surface of the cover, and the recess-shaped uneven part is formed in a continuous manner from the abutment restricting surface.

In an electrical junction box according to embodiments in which a cover is externally fitted to a main body and the main body is accommodated in the cover, a gap between an opening end surface of the cover and an abutment restricting surface of the main body that opposes the opening end surface of the cover is likely to serve as an entrance for water. Therefore, the recess-shaped uneven part is formed in a continuous manner from the abutment restricting surface so as to prevent capillary action from acting at the time when water enters the cover, and thereby it is possible to effectively prevent the water from deeply entering the cover.

In a fifth embodiment, there is provided the electrical junction box according to any one of the second to fourth embodiments, wherein the guiding drain groove is formed over an entire length in the horizontal direction of the recess-shaped uneven part.

According to this embodiment, since the guiding drain groove is formed over the entire width of the recess-shaped uneven part, it is possible to capture water climbing in the recess-shaped uneven part in the guiding drain groove more reliably.

In a sixth embodiment, there is provided the electrical junction box according to any one of the first to fifth embodiments, wherein the guiding drain groove is provided on the outer surface of the main body.

Since the circuit board is provided on the main body, if water that has entered the cover reaches the main body, the water will reach the circuit board more likely than in the case where the water moves on the cover. Furthermore, it is often the case that the water that has entered the cover moves on the main body. Accordingly, by forming the guiding drain groove on the main body, it is possible to effectively capture the water that has entered the cover.

Advantageous Effects

According to embodiments, at least one of the outer surface of the main body and the inner surface of the cover is provided with a guiding drain groove for guiding water in a horizontal direction using capillary action. Accordingly, it is possible for water that has entered the cover to be captured in the guiding drain groove and to be guided in the horizontal direction. As a result, the water that has entered the cover can be prevented from moving upward and reaching the circuit board, making it possible to prevent a short circuit or corrosion of the circuit board due to the circuit board getting wet.

DETAILED DESCRIPTION

Hereinafter, disclosed embodiments will be described with reference to the drawings.

Figure 1:
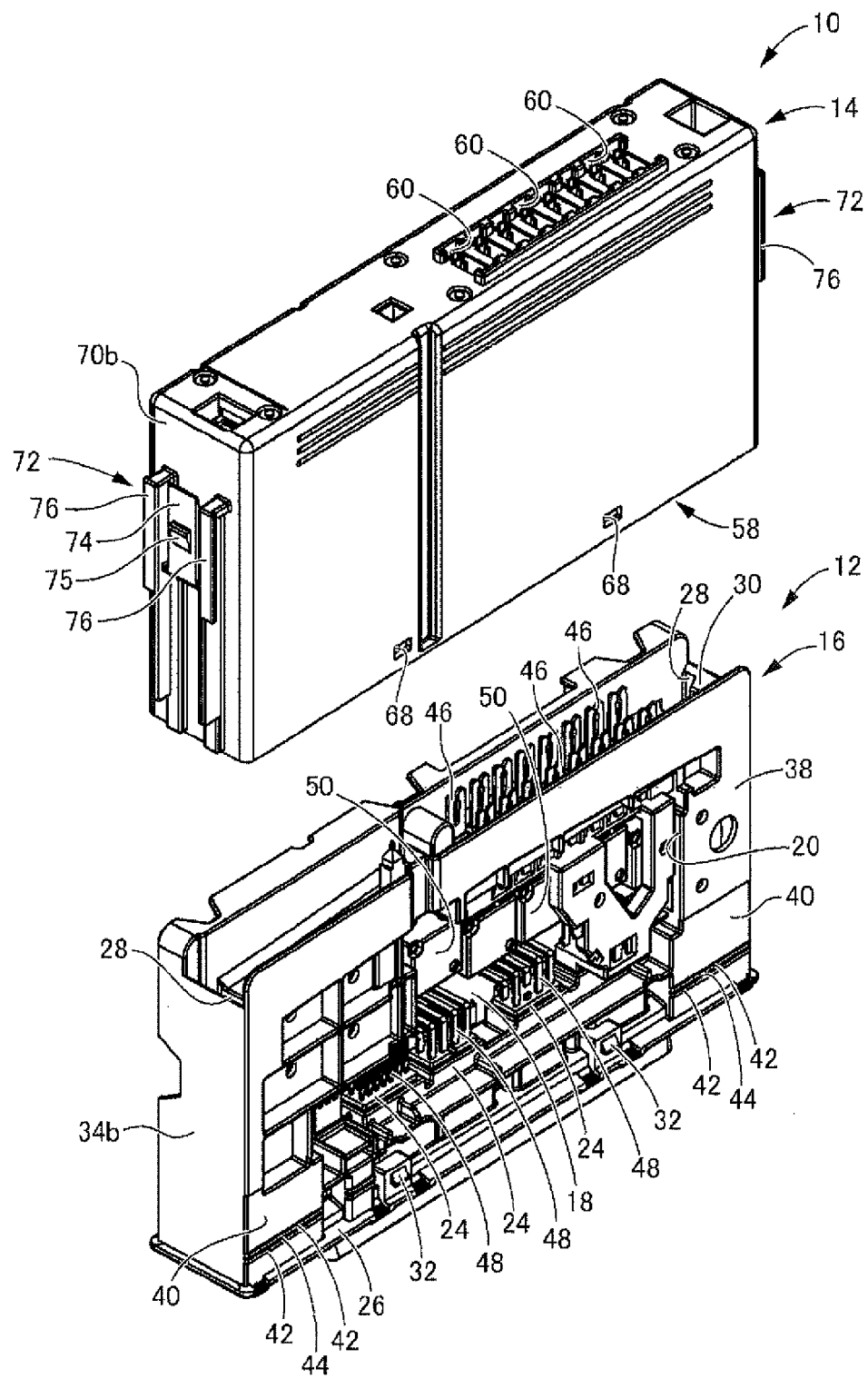
FIG. 1 is an exploded perspective view of an electrical junction box according to an embodiment.

First, FIG. 1 shows an electrical junction box 10 according to an embodiment. The electrical junction box 10 includes a main body 12 and a cover 14, and by being externally fitted to the main body 12, the cover 14 is assembled such that the main body 12 is accommodated in the cover 14. The electrical junction box 10 is accommodated in, for example, another electrical junction box such as a relay box, and is mounted in a vehicle such as an automobile.

Figure 2:
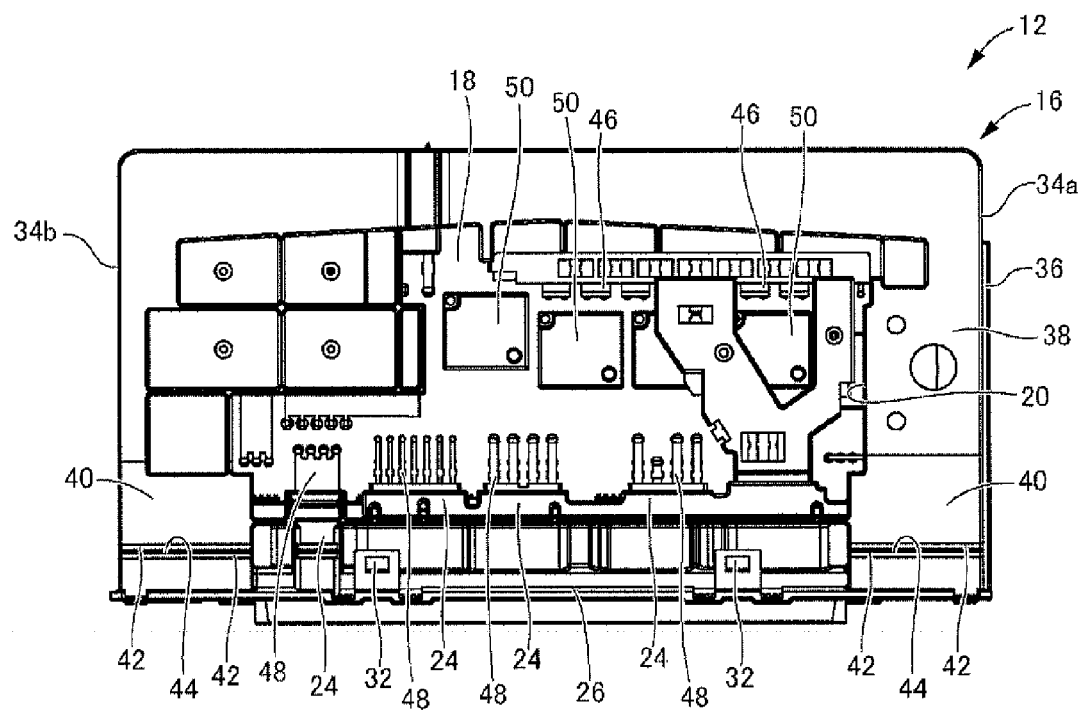
FIG. 2 is a front view of a main body according to an embodiment.
Figure 3:
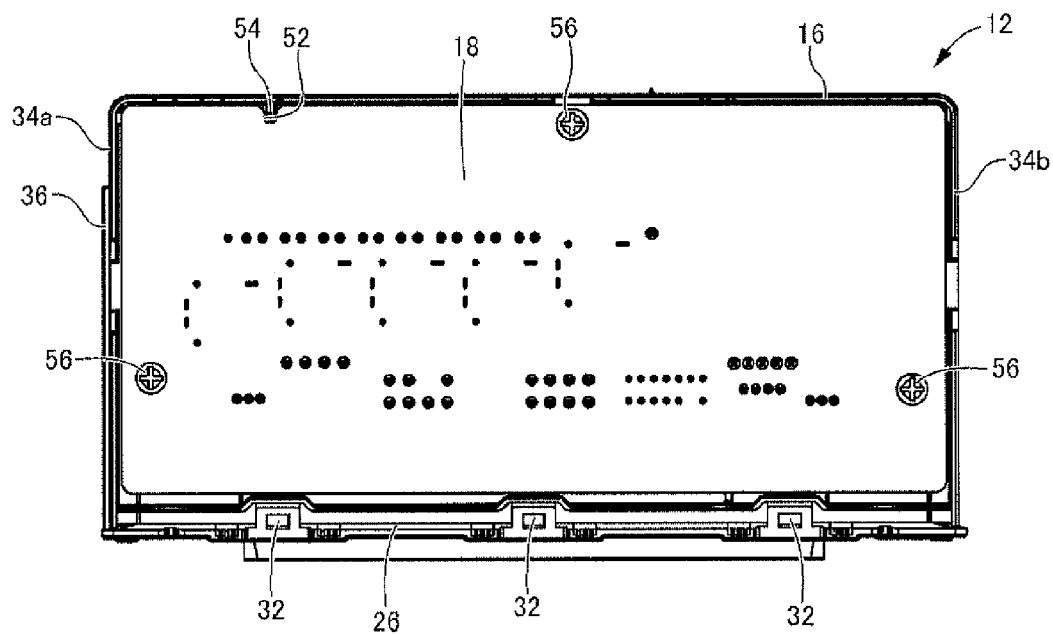
FIG. 3 is a rear view of the main body according to an embodiment.
Figure 4:
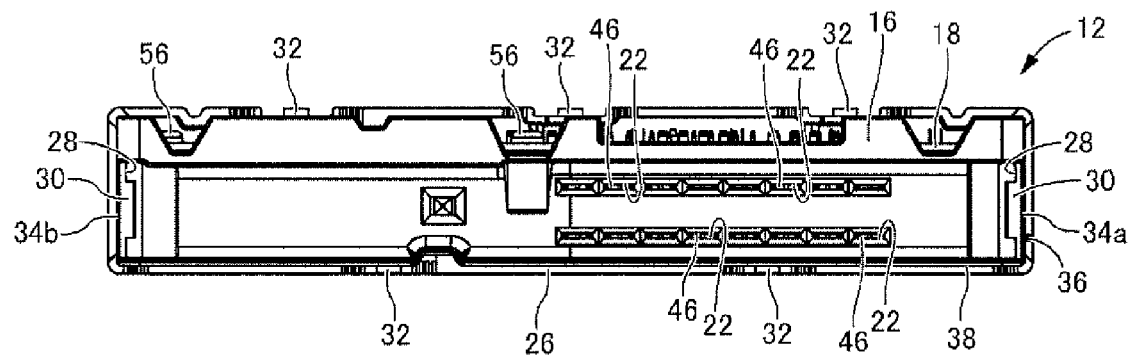
FIG. 4 is a top view of the main body according to an embodiment.

FIGS. 2 to 4 show the main body 12. The main body 12 has an elongated rectangular block shape as a whole. The main body 12 has a structure in which a printed-circuit board 18 serving as a circuit board is assembled in a frame 16 made of a synthetic resin. Note that the circuit board is not limited to a printed-circuit board, and may also be busbars and the like. The main body 12 is configured to be mounted in a vehicle such that up-down direction in FIG. 2 is the vertical up-down direction. In the following description, the vertical direction refers to the vertical direction in FIG. 2.

The frame 16 has a shape of a substantially elongated rectangular frame that has, in the center thereof, a center hole 20. As shown in FIG. 4, a plurality of fuse terminal insertion holes 22 into which fuse terminals 46, which will be described later, are to be inserted are formed in parallel to each other in two lines on substantially half of the upper surface of the frame 16 with respect to the longitudinal direction, and the fuse terminal insertion holes 22 in the respective lines face each other. Furthermore, in the lower portion of the frame 16, a plurality of connectors 24 into which connector terminals 48, which will be described later, are inserted are formed in a line in the longitudinal direction of the frame 16.

Furthermore, an abutment restricting surface 26 is formed on the lower end of the frame 16. As is clear from FIG. 4, the abutment restricting surface 26 is formed protruding outward from the frame 16 and extending continuously over substantially the entire periphery of the frame 16. Furthermore, as is clear from, for example, FIG. 6, which will be described later, the abutment restricting surface 26 is an inclined surface that is inclined downward as it extends outward from the frame 16.

Furthermore, drain holes 28 that are formed penetrating through the frame 16 in the vertical direction are respectively formed on two ends in the longitudinal direction (the horizontal direction in FIG. 4) of the frame 16. The inner surface of each of the drain holes 28 that is located outward in the longitudinal direction of the frame 16 has a main locking claw 30 protruding inward in the drain hole 28.

Furthermore, a plurality of sub locking claws 32 are formed slightly above the abutment restricting surface 26 on the front surface (see FIG. 2) and the rear surface (see FIG. 3) of the frame 16. Each sub locking claw 32 is formed protruding outward from the frame 16. The sub locking claws 32 are formed with appropriate intervals in the direction of the perimeter of the frame 16, two sub locking claws being formed on the front surface of the frame 16 and three sub locking claws being formed on the rear surface of the frame 16.

Furthermore, a side wall 34a located at one end in the longitudinal direction of the frame 16 has a guide rib 36. The guide rib 36 protrudes outward from the side wall 34a in the longitudinal direction of the frame 16, and extends in a straight line over substantially the entire length in the vertical direction of the side wall 34a. On the other hand, a side wall 34b that is opposite to the side wall 34a is a flat surface. Accordingly, the guide rib 36 is formed at only one location on the periphery of the main body 12.

Furthermore, two recess-shaped uneven parts 40 are respectively formed on the two ends in the longitudinal direction of a front side surface 38 of the frame 16 that constitutes the outer surface of the main body 12. Since the recess-shaped uneven parts 40 have substantially the same structure, the recess-shaped uneven part 40 on the right side in FIG. 2 will be described, and the same reference numeral is given to the recess-shaped uneven part 40 on the left side in FIG. 2 and a description thereof is omitted.

Figure 5:
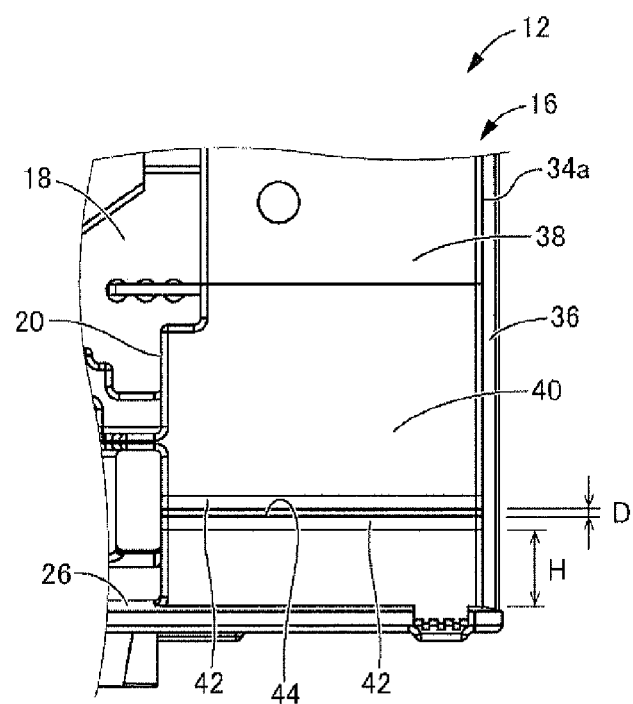
FIG. 5 is an enlarged view of a relevant part of the front surface of the main body according to an embodiment.
Figure 6:
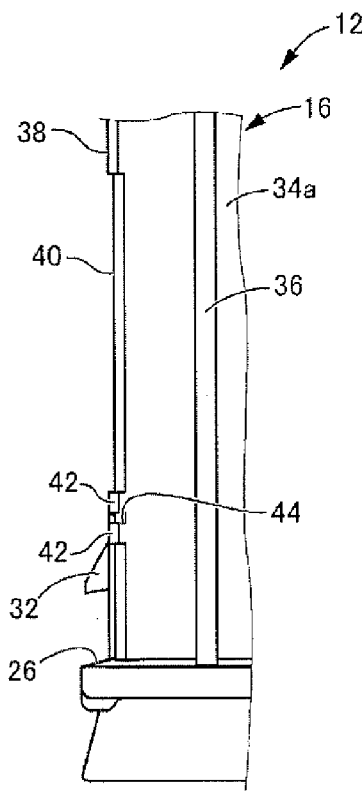
FIG. 6 is an enlarged view of a relevant part of a side surface of the main body according to an embodiment.

As shown in FIGS. 5 and 6, the recess-shaped uneven part 40 has the shape of a recess such that the surface 38 is recessed so as to be uneven. The recess-shaped uneven part 40 is formed over the entire width in the width direction (horizontal direction in FIG. 5) of the surface 38 from the side wall 34a to the center hole 20, and over a predetermined vertical dimension. Furthermore, the recess-shaped uneven part 40 is formed in a lower end portion of the surface 38, extending in a continuous manner from the abutment restricting surface 26.

The recess-shaped uneven part 40 includes a pair of water stopping protrusions 42. The water stopping protrusions 42 are protrusions that protrude from the recess-shaped uneven part 40 in the intermediate portion in the vertical direction of the recess-shaped uneven part 40 and extend in straight lines in the right-left direction that is the horizontal direction (horizontal direction in FIG. 5), and are formed over the entire length in the horizontal direction of the recess-shaped uneven part 40. A vertical dimension H between the lower water stopping protrusion 42 and the lower end edge of the recess-shaped uneven part 40 is ensured to be a size in which water does not climb due to capillary action, and in the present embodiment for example, the vertical dimension H between the lower water stopping protrusion 42 and the lower end edge of the recess-shaped uneven part 40 is set to about 10 mm. The two water stopping protrusions 42 are formed in parallel to each other with a small gap D in the vertical direction. The gap D between the water stopping protrusions 42 is set to a size in which capillary action acts, and is set to about 0.2 mm, for example, in the present embodiment. Furthermore, a guiding drain groove 44 is formed by the gap between the pair of water stopping protrusions 42. Accordingly, the guiding drain groove 44 is formed in the intermediate portion in the vertical direction of the recess-shaped uneven part 40 over the entire length in the right-left direction that is the horizontal direction.

The printed-circuit board 18 is assembled to the rear surface (see FIG. 3) of that frame 16. The printed-circuit board 18 has an elongated rectangular plate shape extending over substantially the entire rear surface of the frame 16. The printed-circuit board 18 is provided with a plurality of fuse terminals 46, which are to be connected to fuses (not shown), and a plurality of connector terminals 48, which are to be connected to connectors (not shown). The fuse terminals 46 and the connector terminals 48 are bent into an L-shape. Furthermore, a plurality of relays 50 are provided in the central portion of the printed-circuit board 18.

The printed-circuit board 18 is assembled to the frame 16 such that, for example, the fuse terminals 46 and the connector terminals 48 are inserted in advance into the fuse terminal insertion holes 22 and the connector sections 24 of the frame 16, and, in this state, the printed-circuit board 18 on which the relays 50 are provided is overlaid on the rear surface of the frame 16. Note that, as shown in FIG. 3, a notch 52 is formed on the periphery of the printed-circuit board 18, and the printed-circuit board 18 is positioned with respect to the frame 16 by a positioning protrusion 54 of the frame 16 being inserted into the notch 52. Accordingly, the fuse terminals 46 and the connector terminals 48 are inserted through the corresponding through holes of the printed-circuit board 18. Furthermore, after the printed-circuit board 18 is fixed to the frame 16 with a plurality (three in the present embodiment) of bolts 56, the fuse terminals 46 and the connector terminals 48 are fixed to the printed-circuit board 18 by soldering. The main body 12 is configured in this manner.

Figure 7:
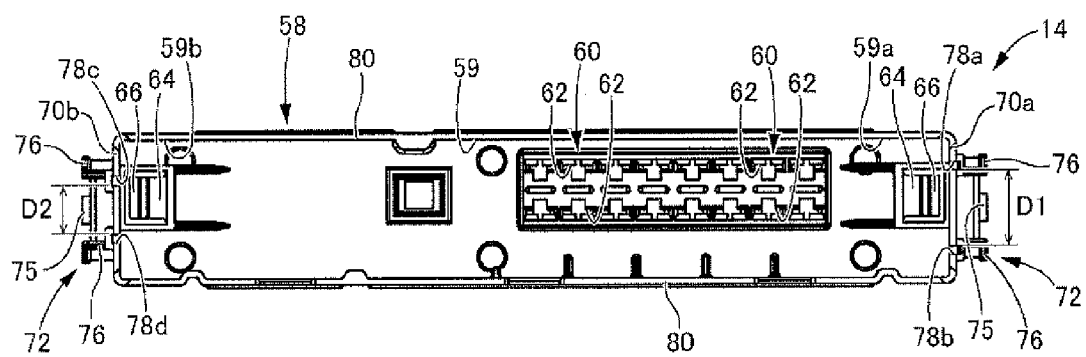
FIG. 7 is a bottom view of a cover according to an embodiment.

On the other hand, the cover 14 is a synthetic resin molded article that is formed into one piece. FIG. 7 shows the lower surface of the cover 14. The cover 14 has an elongated rectangular box shape, and has an opening 58 on one side thereof. Among inner surfaces 59 of the cover 14, inner surfaces 59a and 59b that oppose the recess-shaped uneven parts 40 of the main body 12 are flat. The upper surface of the cover 14 has a plurality of fuse mounted sections 60 that are formed in one line over substantially half of the upper surface of the cover 14 with respect to the longitudinal direction. Each fuse mounted section 60 has a pair of terminal insertion holes 62 that penetrate through the upper surface of the cover 14 and oppose each other.

Furthermore, a pair of main locks 64 are formed on the two longitudinal ends of the cover 14. The main locks 64 have elastically deformable protruding pieces that protrude downward into the cover 14 from the upper surface of the cover 14, the main locks 64 being formed into one piece with the cover 14. The main locks 64 respectively have engaging claws 66 that protrude outward in the longitudinal direction of the cover 14.

Furthermore, as is clear from FIG. 1, rectangular sub lock holes 68 are formed in the lower end portion of the cover 14 at positions that correspond to the sub locking claws 32 of the main body 12, the rectangular sub lock holes 68 penetrating through the cover 14. In the present embodiment, two sub lock holes 68 are formed on the surface of the cover 14 that overlaps the front surface (see FIG. 2) of the main body 12, whereas three sub lock holes 68 are formed on the surface of the cover 14 that overlaps the rear surface (see FIG. 3) of the main body 12.

Furthermore, external locks 72 are formed on outer surfaces of side walls 70a and 70b of the cover 14 that are opposite to each other in the longitudinal direction. The external locks 72 have substantially the same shape, and a pair of guiding sections 76 that have an L-shaped cross section and extend in the vertical direction are formed on the two sides of an elastic piece 74 that protrudes outward from the side wall 70a (or 70b) and extends upward. The elastic piece 74 has an engagement protrusion 75.

Furthermore, the side wall 70a has drain recess grooves 78a and 78b, whereas the side wall 70b has drain recess grooves 78c and 78d. These drain recess grooves 78a to 78d have substantially the same shape, and have the shape of a groove that opens to the inner surface of the cover 14 by the side wall 70a (or the 70b) protruding outward from the cover 14, and extends in a straight line in the vertical direction. Note that the lower end edges of the drain recess grooves 78a to 78d open on an open end surface 80 of the cover 14. Furthermore, a distance D1 between the drain recess grooves 78a and 78b of the side wall 70a differs from a distance D2 between the drain recess grooves 78c and 78d of the side wall 70b. The drain recess groove 78a of the side wall 70a is formed at a position that corresponds to the guide rib 36 of the main body 12. Accordingly, if an attempt is made to assemble the cover 14 to the main body 12 in the wrong direction, the guide rib 36 of the main body 12 will interfere with the cover 14, preventing a fault in coupling.

Figure 8:
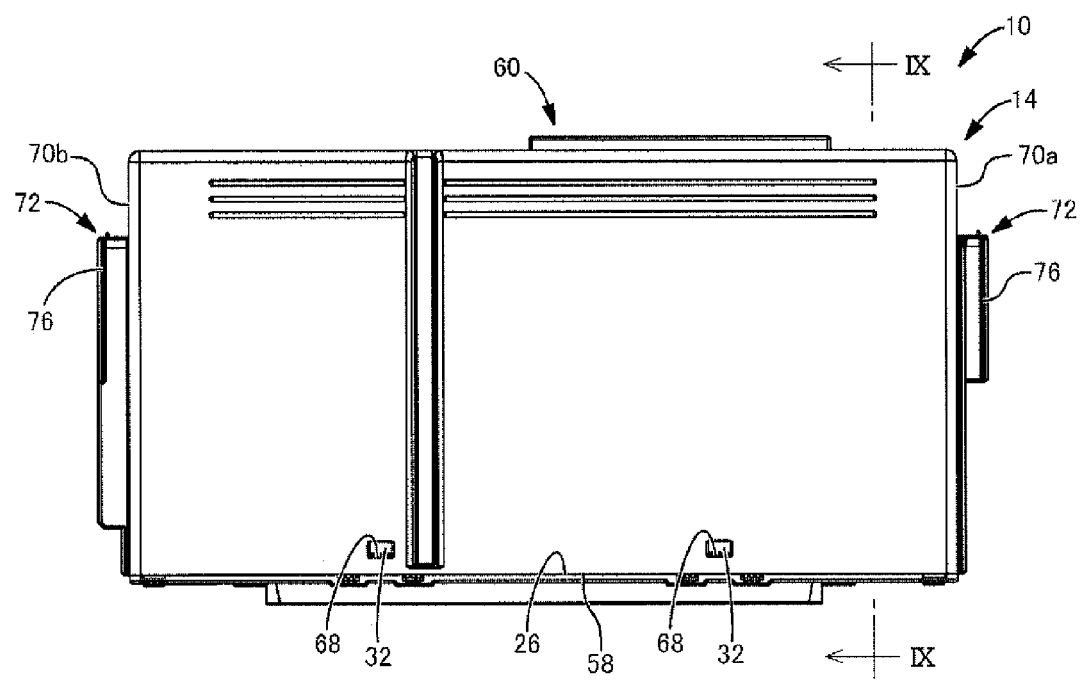
FIG. 8 is a front view showing the state in which the cover and the main body of the electrical junction box of FIG. 1 are assembled according to an embodiment.

As shown in FIG. 1, the cover 14 is externally fitted to the main body 12 from above. Note that, by the guide rib 36 provided on the side wall 34a of the main body 12 being inserted into the drain recess groove 78a provided on the side wall 70a, the cover 14 can be guided in the vertical direction, which is the direction in which the cover is externally fitted to the main body 12, and can be externally fitted smoothly to the main body 12. The extent to which the cover 14 is externally fitted to the main body 12 is defined by the open end surface 80 of the cover 14 abutting against the abutment restricting surface 26 of the main body 12. Moreover, the cover 14 is fixed to the main body 12 by the engaging claws 66 of the main locks 64 provided inside the cover 14 respectively engaging with the main locking claws 30 of the main body 12, and a plurality of sub lock holes 68 of the cover 14 respectively engaging with the sub locking claws 32 of the main body 12. Accordingly, as shown in FIG. 8, the main body 12 and the cover 14 are assembled to each other in the state in which the portion of the main body 12 that is located above the abutment restricting surface 26 is accommodated in the cover 14, and thus the electrical junction box 10 is formed. Furthermore, the plurality of fuse terminals 46 (see FIG. 1 and the like) provided on the main body 12 are inserted into the terminal insertion holes 62 of the fuse mounted sections 60 provided on the cover 14, and are arranged in the fuse mounted sections 60.

In the electrical junction box 10 having this structure, fuses (not shown) are respectively mounted on the respective fuse mounted sections 60. The electrical junction box 10 is configured to be accommodated in another electrical junction box (not shown) such as a relay box, for example, and fixed thereto via the external locks 72 provided on the cover 14, and thereby the connector sections 24 are connected to connectors provided in the other electrical junction box.

Figure 9:
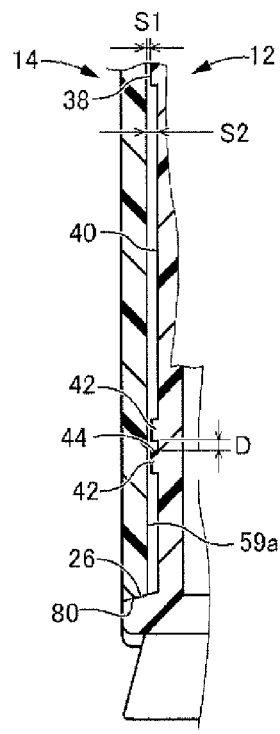
FIG. 9 illustrates a relevant part of a cross section taken along the line IX-IX of FIG. 8.

In the electrical junction box 10 having the structure according to the present embodiment, as shown in FIG. 9, by the cover 14 being assembled to the main body 12, the surface 38 of the main body 12 opposes the inner surface 59 of the cover 14. An opposing distance Si between the surface 38 of the main body 12 and the inner surface 59 of the cover 14 is set to be very small since an unnecessary space is not provided between the main body 12 and the cover 14, and is set to about 0.2 mm in, for example, the present embodiment. Furthermore, the recess-shaped uneven part 40 on the surface 38 is spaced from the inner surface 59a (or 59b) of the cover 14 that the recess-shaped uneven part 40 opposes, and an opposing distance S2 is larger than the opposing distance S1. The opposing distance S2 between the recess-shaped uneven part 40 and the inner surface 59a (or 59b) is set to a distance at which no capillary action acts, and to about 0.5 mm in the present embodiment, for example.

Accordingly, even in the case where water enters the cover 14 from, for example, a micro-gap between the opening end surface 80 of the cover 14 and the abutment restricting surface 26 of the main body 12, the recess-shaped uneven part 40 prevents the water that has entered the cover 14 from climbing within the cover 14 (moving vertically upward) since the opposing distance S2 between the recess-shaped uneven part 40 and the inner surface 59a (59b) of the cover 14 is set to a distance at which no capillary action acts.

As a result, it is possible to prevent the water that has entered the cover 14 from reaching the printed-circuit board 18, and to prevent a short circuit or corrosion of the printed-circuit board 18 due to the printed-circuit board 18 getting wet. Particularly, in the present embodiment, the recess-shaped uneven part 40 is formed in a continuous manner from the abutment restricting surface 26. Accordingly, at the time when water enters the gap between the abutment restricting surface 26 and the cover 14, the recess-shaped uneven part 40 can prevent the water from further climbing, and thus it is possible to effectively prevent the entering of the water.

Furthermore, the pair of water stopping protrusions 42 are formed in the intermediate portion in the vertical direction of the recess-shaped uneven part 40. Accordingly, even when water has climbed over the recess-shaped uneven part 40, these double water stopping protrusions 42 can prevent the climbing of the water.

Furthermore, the guiding drain groove 44 is formed between the pair of water stopping protrusions 42, and a groove width dimension D of the guiding drain groove 44 is set to a very small dimension at which capillary action acts. Accordingly, even when water has climbed across the water stopping protrusions 42 located vertically below, the guiding drain groove 44 can capture the water and guide the water in the horizontal direction using capillary action, making it possible to prevent the water from moving vertically upward.

Moreover, water that enters a gap between the opening end surface 80 of the cover 14 and the abutment restricting surface 26 of the main body 12 is likely to move on the main body 12 side via the abutment restricting surface 26 located below. Furthermore, since the printed-circuit board 18 is provided on the main body 12, it is highly likely for the water moving on the main body 12 side to reach the printed-circuit board 18. Therefore, in the present embodiment, since the recess-shaped uneven parts 40 and the guiding drain grooves 44 are formed on the main body 12 side, it is possible to effectively prevent the water moving on the main body 12 side from reaching a deeper location.

Furthermore, since the drain recess grooves 78a to 78d are formed on the side walls 70a and 70b of the cover 14, opposing distances between the drain recess grooves 78a to 78d and the corresponding side walls 34a and 34b of the main body 12 are large. As a result, capillary action between the side walls 70a, 70b of the cover 14 and the side walls 34a, 34b of the main body 12 can be prevented in the drain recess grooves 78a to 78d, making it possible to capture water moving between the side walls 70a, 70b and the side walls 34a, 34b in the drain recess grooves 78a to 78d, and to achieve a further improvement in the effect of preventing entering of the water.

Figure 10:
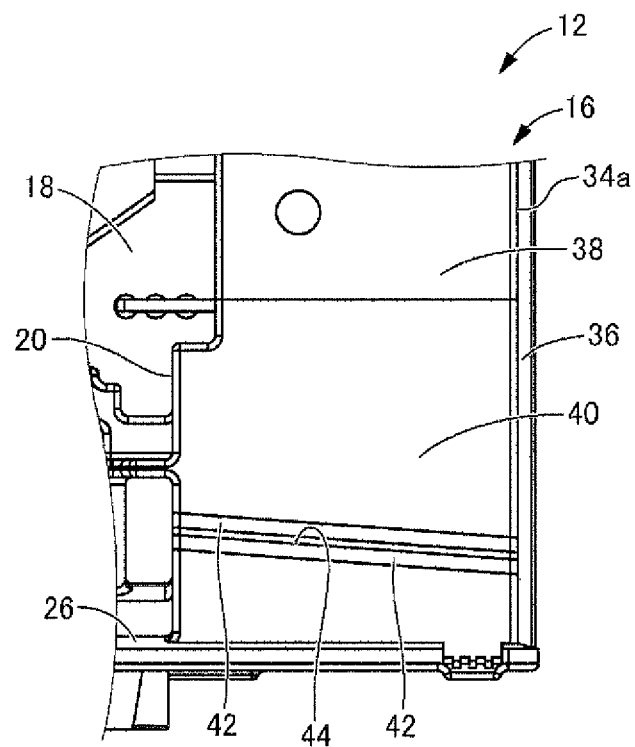
FIG. 10 is an enlarged view of a relevant part showing another embodiment that corresponds to FIG. 5.

Although disclosed embodiments have been described in detail so far, this disclosure is not limited to the specific description thereof. For example, as shown in FIG. 10, the guiding drain groove 44 may be inclined in the vertical up-down direction (vertical direction in FIG. 10), or may have the shape extending in the horizontal direction while being inclined in the vertical up-down direction. Accordingly, it is possible to effectively prevent the water from entering the cover using capillary action together with gravity action. Furthermore, the number of the guiding drain grooves is not limited, and a plurality of guiding drain grooves extending, for example, in the vertical up-down direction of the main body may also be formed.

Figure 11:
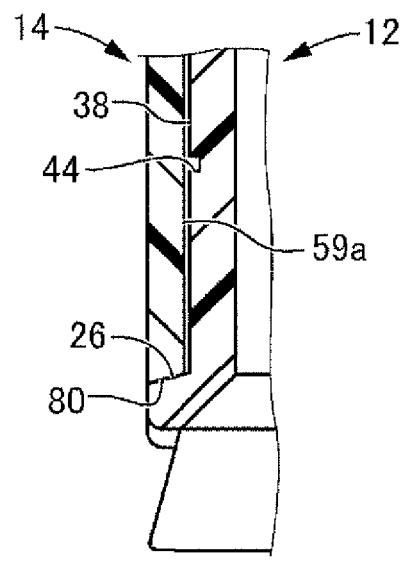
FIG. 11 illustrates another embodiment that corresponds to FIG. 9.

Furthermore, the recess-shaped uneven parts may also be provided in the intermediate portions in the vertical up-down direction of the main body. Moreover, the recess-shaped uneven parts and the water stopping protrusions are not necessarily essential, and as shown in FIG. 11 for example, a configuration is also possible in which a recess-shape guiding drain groove 44 is formed on an even surface 38 of the main body 12, or a guiding drain groove is formed on the surface of the recess-shaped uneven part without forming the water stopping protrusions, for example. Moreover, the guiding drain groove may also be formed on the inner surface of the cover, and guiding drain grooves may also be formed on both of the inner surface of the cover and the outer surface of the main body, for example.

It will be appreciated that the above-disclosed features and functions, or alternatives thereof, may be desirably combined into different systems or methods. Also, various alternatives, modifications, variations or improvements may be subsequently made by those skilled in the art, and are also intended to be encompassed by the following claims As such, various changes may be made without departing from the spirit and scope of this disclosure as defined in the claims.

LIST OF REFERENCE NUMERALS

10 Electrical junction box
12 Main body
14 Cover
18 Printed-circuit board (circuit board)
26 Abutment restricting surface
38 Surface (outer surface of the main body)
40 Recess-shaped uneven part
42 Water stopping protrusion
44 Guiding drain groove
59 Inner surface
80 Opening end surface

The invention claimed is:

1. An electrical junction box comprising:
a main body including a circuit board;
a cover externally fitted to the main body and assembled in a state in which the main body is accommodated in the cover,
wherein at least one of an outer surface of the main body and an inner surface of the cover that oppose each other in a state in which the cover is assembled is provided with a recess-shaped uneven part that extends in a vertical direction and has a shape of a recess that is spaced from the corresponding opposing inner surface of the cover or opposing outer surface of the main body, and
the recess-shaped uneven part is provided with a guiding drain groove extending in a horizontal direction parallel to a planar direction of at least one of the outer surface of the main body and the inner surface of the cover, the guiding drain groove configured to guide water in the horizontal direction using capillary action.

2. The electrical junction box according to claim 1, wherein the recess-shaped uneven part has a pair of water stopping protrusions that extend substantially in parallel to each other in a horizontal direction, and the guiding drain groove is formed by a gap between the pair of water stopping protrusions.

3. The electrical junction box according to claim 1, wherein the main body includes an abutment restricting surface that protrudes outward from the main body and opposes an opening end surface of the cover, and
the recess-shaped uneven part is formed in a continuous manner from the abutment restricting surface.

4. The electrical junction box according to claim 1, wherein the guiding drain groove is formed over an entire length in the horizontal direction of the recess-shaped uneven part.

5. The electrical junction box according to claim 1, wherein the guiding drain groove is provided on the outer surface of the main body.

* * * * *